(12) United States Patent
Kabashima et al.

(10) Patent No.: US 7,991,370 B2
(45) Date of Patent: Aug. 2, 2011

(54) AMPLIFIER CIRCUIT AND RECEIVING DEVICE

(75) Inventors: Tadashi Kabashima, Kagoshima (JP); Shoichi Kuroki, Kagoshima (JP); Toshio Chikaki, Kagoshima (JP)

(73) Assignee: Sony Corporation, Tokyo (JP)

( * ) Notice: Subject to any disclaimer, the term of this patent is extended or adjusted under 35 U.S.C. 154(b) by 761 days.

(21) Appl. No.: 11/973,855

(22) Filed: Oct. 10, 2007

(65) Prior Publication Data

US 2008/0090535 A1    Apr. 17, 2008

(30) Foreign Application Priority Data

Oct. 13, 2006    (JP) ................. P2006-280657

(51) Int. Cl.
*H04B 1/18* (2006.01)
(52) U.S. Cl. ................. 455/188.1; 455/232.1
(58) Field of Classification Search ............ 455/130, 455/140, 142, 188.1, 188.2, 232.1, 254, 341; 330/291, 293, 294; 348/720, 730, 731
See application file for complete search history.

(56) References Cited

U.S. PATENT DOCUMENTS

| | | | |
|---|---|---|---|
| 5,914,640 A * | 6/1999 | Nasserbakht | 455/341 |
| 6,873,207 B2 * | 3/2005 | Sakuno | 330/110 |
| 2003/0035070 A1 * | 2/2003 | Fanous et al. | 348/720 |

FOREIGN PATENT DOCUMENTS

| | | |
|---|---|---|
| JP | 63-054004 | 3/1988 |
| JP | 05-121953 | 5/1993 |
| JP | 2752795 | 2/1998 |
| JP | 2005-203935 | 7/2005 |

* cited by examiner

*Primary Examiner* — Thanh C Le
(74) *Attorney, Agent, or Firm* — Robert J. Depke; Rockey, Depke & Lyons, LLC

(57) ABSTRACT

Disclosed herein is an amplifier circuit formed by multiple transistor stages and having an input terminal for a signal and an inverted output terminal configured to output an inverted signal after amplification, wherein a feedback resistance and a feedback capacitor for input impedance matching are connected in series with each other between the inverted output terminal and the input terminal.

4 Claims, 6 Drawing Sheets m1
freq=40MHz
S(1,1)=0.441/-44.119
Impedance=Z0×(1.435-j1.093)

m2
freq=2.1GHz
S(1,1)=0.287/-158.600
Impedance=Z0×(0.568-j0.130)

Freq(40MHz to 2.1GHz)

m1
freq=40MHz
S(1,1)=0.827/-3.536
Impedance=Z0×(9.547-j3.078)

m2
freq=2.1GHz
S(1,1)=0.549/-171.474
Impedance=Z0×(0.293-j0.068)

Freq(40MHz to 2.1GHz)

AMPLIFIER CIRCUIT AND RECEIVING DEVICE

CROSS REFERENCES TO RELATED APPLICATIONS

The present invention contains subject matter related to Japanese Patent Application JP 2006-280657 filed in the Japan Patent Office on Oct. 13, 2006, the entire contents of which being incorporated herein by reference.

BACKGROUND OF THE INVENTION

1. Field of the Invention

The present invention relates to an amplifier circuit for amplifying a high-frequency signal and a receiving device, and particularly to a wide-band amplifier circuit of a negative feedback type and a receiving device including the amplifier circuit.

2. Description of the Related Art

Amplifier circuits in related art are known for amplifying a signal received via an antenna. Of the amplifier circuit in related arts, an amplifier circuit using a grounded-emitter circuit in a first stage and using an emitter follower in a succeeding stage will be described with reference to FIG. 11.

FIG. 11 is a diagram showing an open gain amplifier circuit 110 using a grounded-emitter circuit as a transistor in a first stage and using an emitter follower as a transistor in a succeeding stage.

The first stage transistor Q101 in the amplifier circuit 110 of FIG. 11 forms a grounded-emitter circuit that receives a high-frequency signal from a base (input terminal) and then outputs a first amplified signal from a collector. The first amplified signal output from the collector of the first stage transistor Q101 is input to the base of a succeeding stage transistor Q102. Then, an inverted signal amplified with a gain Av≈R102/R103 with respect to the input voltage can be obtained from the emitter of the succeeding stage transistor Q102.

In addition, an invention of a negative feedback amplifier having a capacitance added in parallel with a feedback resistance is known (see for example, Japanese Patent No. 2752795, hereinafter referred to as Patent Document 1).

The negative feedback amplifier shown in FIG. 1 of Patent Document 1 is an amplifier formed by a cascade connection of a collector-load grounded-emitter amplifier circuit in a preceding stage formed by connecting a collector resistance $R_{C1}$, an NPN-type bipolar transistor $Q_1$, and an emitter resistance $R_{E1}$ in series with each other and an amplifier circuit in a succeeding stage formed by a collector resistance $R_{C2}$, an NPN transistor $Q_2$, and an emitter resistance $R_{E2}$ between a high-level power supply terminal and a grounding terminal. In order to widen a frequency band, an emitter peaking capacitor $C_1$ is connected in parallel with the emitter resistance $R_{E2}$ in the succeeding stage. Further, negative feedback is effected by connecting a feedback resistance $R_{F1}$ and a capacitance $C_{F1}$ in parallel with each other between the emitter of the NPN transistor $Q_2$ in the succeeding stage and the base of the NPN transistor $Q_1$ in the preceding stage.

SUMMARY OF THE INVENTION

However, the input impedance of the amplifier circuit 110 shown in FIG. 11 appears as a parallel connection of the base resistance rb of the first stage transistor Q101 and the parasitic capacitance Cπ of the first stage transistor Q101. Therefore the input impedance S11 of the amplifier circuit 110 is (rb//1/(ω×Cπ)). The impedance of the parasitic capacitance Cπ of this input impedance is expressed as 1/(2×π×f×Cπ). Therefore the impedance of the parasitic capacitance Cπ is decreased in a range where frequency f is high.

On the other hand, the base resistance rb constitutes high impedance regardless of the frequency f. Therefore, when the frequency f becomes high, the impedance of the parasitic capacitance Cπ becomes dominant in the input impedance S11, and the input impedance S11 is decreased.

In a range where the frequency f is low, the impedance of the base resistance rb and the impedance 1/(ω×Cπ) of the parasitic capacitance Cπ both become high, and thus the input impedance S11 (rb//1/(ω×Cπ)) becomes a high value. Thus, the input impedance of the amplifier circuit 110 shown in FIG. 11 changes greatly according to the frequency, so that a flat gain may not be obtained in a wide band.

FIG. 12 is a Smith chart of the input impedance S11 when the frequency is changed from 40 MHz (mark m1) to 2.1 GHz (mark m2) in the amplifier circuit 110 shown in FIG. 11.

A calculation result shown in FIG. 12 indicates that a locus ranges extensively in such a manner as to form an arc from S(1, 1)=0.827/−3.536 (the frequency of 40 MHz and a characteristic impedance=Z0×(9.547−j3.078)) to S(1, 1)=0.549/−171.474 (2.1 GHz and a characteristic impedance=Z0×(0.293−j0.068)).

The input impedance S11 of the amplifier circuit 110 shown in FIG. 11 varies from a reference resistance Z0 to about 10×Z0 (mark m1 in FIG. 12) and to about 0.3×Z0 (mark m2 in FIG. 12) between 40 MHz to 2.1 GHz. Thus, the value of the input impedance of the amplifier circuit 110 shown in FIG. 11 changes greatly, so that a flat gain may not be obtained in a wide frequency band from an FM band or lower (40 MHz and higher) to a BS and CS band (2.1 GHz and lower).

Therefore, in related art, there is a case where impedance matching is performed by inserting an input resistance R101 at the base of the first stage transistor Q101 as shown in FIG. 13 in order to stabilize the gain over the wide band. However, when the input resistance R101 is inserted as shown in FIG. 13, a noise figure deteriorates.

In addition, in the invention described in Patent Document 1, as is shown in FIG. 2 of Patent Document 1, a peak of input impedance is seen in a specific frequency band, and it is considered that the gain of the negative feedback amplifier has a similar peak.

According to an embodiment of the present invention, there is provided an amplifier circuit formed by multiple transistor stages and having an input terminal for a signal and an inverted output terminal for outputting an inverted signal after amplification, wherein a feedback resistance and a feedback capacitor for input impedance matching are connected in series with each other between the inverted output terminal and the input terminal.

According to another embodiment of the present invention, there is provided an amplifier circuit formed by multiple transistor stages, the amplifier circuit including: a first stage transistor for receiving a signal from a base functioning as an input terminal of the amplifier circuit, and outputting a first amplified signal from a collector; a first succeeding stage transistor for receiving the first amplified signal output by the first stage transistor from a base, and outputting an inverted signal from one of an emitter and a collector; and an input impedance matching element for feeding back the inverted signal output by the first succeeding stage transistor to the input terminal via a feedback resistance and a feedback capacitor connected in series with each other.

An amplifier circuit according to yet another embodiment of the present invention further includes a second succeeding stage transistor that receives the first amplified signal output by the first stage transistor from a base, and has an output terminal for outputting the signal from one of an emitter and a collector to an outside.

Further, according to an embodiment of the present invention, there is provided a receiving device for selecting a specific frequency from a signal including a plurality of frequency bands and obtaining data, the receiving device including: an input terminal for receiving the signal of the plurality of frequency bands; an amplifier circuit including a feedback resistance and a feedback capacitor for input impedance matching, the feedback resistance and the feedback capacitor being connected in series with each other between the input terminal and an inverted output terminal for outputting an inverted signal after amplification; a splitter for dividing the signal amplified by the amplifier circuit; a band-pass filter for extracting a signal in a predetermined frequency band from the divided signal; and a tuner for selecting a specific frequency from the extracted signal, and obtaining data included in a signal of the selected frequency.

According to the embodiments of the present invention, a feedback resistance and a feedback capacitor for input impedance matching are connected in series with each other between an inverted output terminal and an input terminal. It is therefore possible to perform impedance matching over a wide band without degrading a noise figure. Thereby the gain of the amplifier circuits can be made flatter.

In addition, the amplifier circuit according to the embodiments of the present invention includes a second succeeding stage transistor that receives the first amplified signal output by the first stage transistor from a base, and has an output terminal for outputting the signal from one of an emitter and a collector to an outside. It is therefore possible to output a signal unaffected by an amount of feedback.

In addition, the receiving device according to the embodiments of the present invention includes: an amplifier circuit including a feedback resistance and a feedback capacitor for input impedance matching, the feedback resistance and the feedback capacitor being connected in series with each other between an input terminal for receiving a signal including a plurality of frequency bands and an inverted output terminal; a splitter for dividing a signal amplified by the amplifier circuit; a band-pass filter for extracting a signal in a predetermined frequency band from the divided signal; and a tuner for selecting a specific frequency from the extracted signal, and obtaining data included in a signal of the selected frequency. Therefore the level of signals supplied to respective tuners can be made uniform.

The above and other features and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

An amplifier circuit according to an embodiment of the present invention has an input terminal for a signal and an inverted output terminal for outputting an inverted signal after amplification, wherein a feedback resistance and a feedback capacitor for input impedance matching are connected in series with each other between the inverted output terminal and the input terminal. It is therefore possible to perform impedance matching over a wide band without degrading a noise figure. Thereby the gain of the amplifier circuit can be made flatter.

An amplifier circuit according to an embodiment of the present invention includes: a first stage transistor for receiving a signal from a base terminal functioning as an input terminal, and outputting a first amplified signal from a collector terminal; a first succeeding stage transistor for receiving the first amplified signal output by the first stage transistor from a base terminal, and outputting an inverted signal from one of an emitter terminal and a collector terminal; and an input impedance matching element for feeding back the inverted signal output by the first succeeding stage transistor to the input terminal via a feedback resistance and a feedback capacitor connected in series with each other. It is therefore possible to perform impedance matching over a wide band without degrading the noise figure of the amplifier circuit. Thereby the gain of the amplifier circuit can be made flatter.

An amplifier circuit according to an embodiment of the present invention includes a second succeeding stage transistor that receives the first amplified signal output by the first stage transistor from a base, and has an output terminal for outputting the signal from one of an emitter and a collector to an outside. It is therefore possible to output a signal unaffected by an amount of feedback.

In addition, a receiving device according to an embodiment of the present invention includes: an amplifier circuit including a feedback resistance and a feedback capacitor for input impedance matching, the feedback resistance and the feedback capacitor being connected in series with each other between an input terminal for receiving a signal including a plurality of frequency bands and an inverted output terminal; a splitter for dividing a signal amplified by the amplifier circuit; a band-pass filter for extracting a signal in a predetermined frequency band from the divided signal; and a tuner for selecting a specific frequency from the extracted signal, and obtaining data included in a signal of the selected frequency. Therefore the level of signals supplied to respective tuners can be made uniform.

The best mode for carrying out the present invention will hereinafter be described with reference to the drawings.

An example of use of a receiving device including an amplifier circuit for amplifying a high-frequency signal will be described with reference to FIG. 1.

Figure 1:
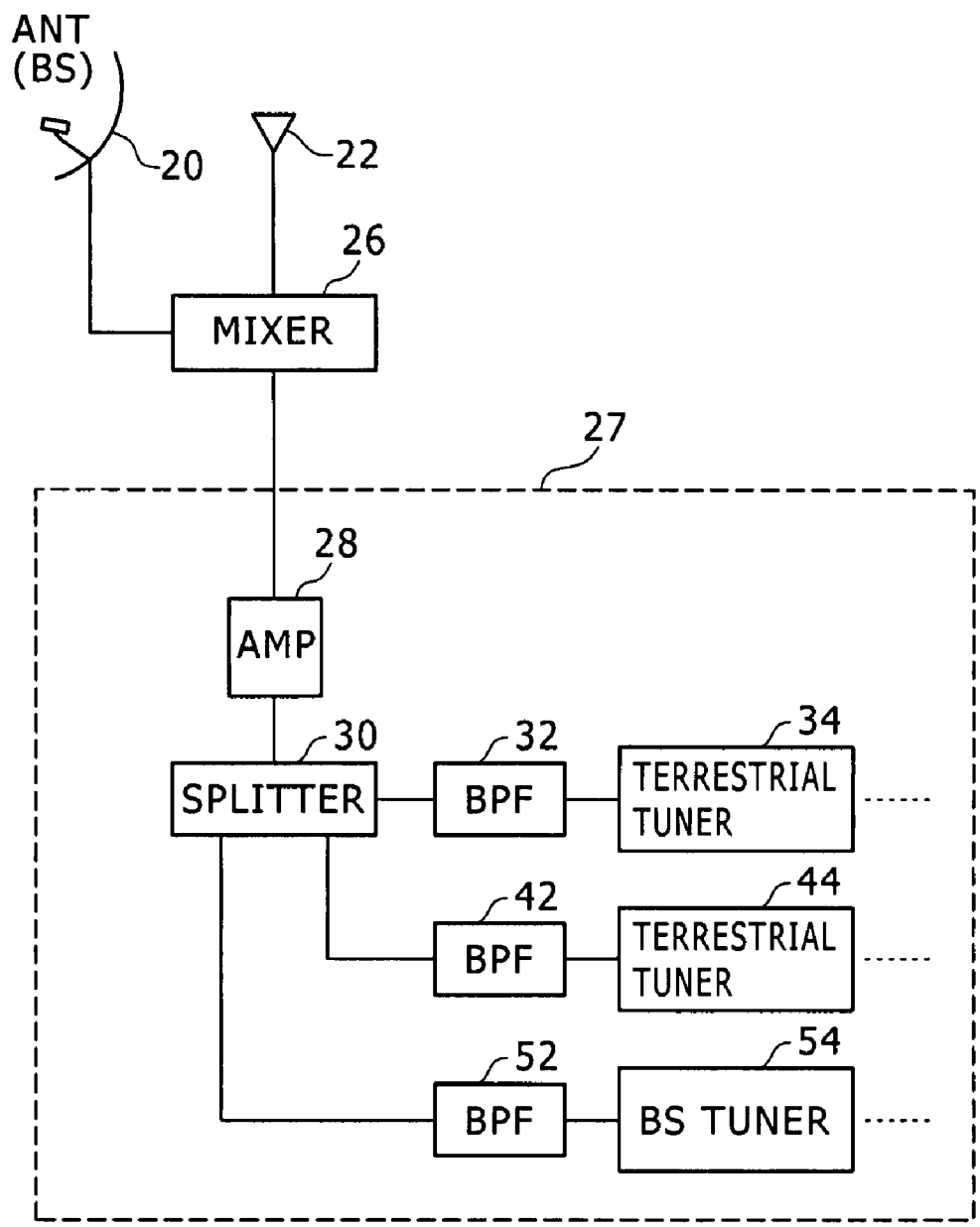
FIG. 1 is a block diagram of a video signal receiving system that distributes a signal for television image reception in which a plurality of frequency bands are mixed to tuners for the respective frequency bands.

FIG. 1 is a block diagram of a video signal receiving system that receives radio waves for a television receiver from a plurality of kinds of antennas, mixes broadcast signals, and distributes the broadcast signals to tuners provided for respective frequency bands.

The video signal receiving system shown in FIG. 1 includes: a BS antenna 20 for receiving radio waves of BS broadcasting; an antenna 22 for receiving terrestrial waves; a mixer 26 for mixing and outputting broadcast signals in respective frequency bands which signals are output from the antennas; and a receiving device 27 for receiving the high-frequency signals of various broadcasts. The receiving device 27 is a receiving device such for example as a television set, a video recorder, or a computer device.

The receiving device 27 includes: an amplifier 28 for receiving and amplifying a mixed broadcast signal; a splitter 30 for dividing the amplified broadcast signal into broadcast signals for respective tuners; band-pass filters 32, 42, and 52 for extracting signals in respective frequency bands to be used by the tuners 34, 44, and 54 for the respective frequency bands from the divided broadcast signals; and the tuners 34, 44, and 54 for selecting a specific frequency from the extracted signals in the respective frequency bands and obtaining video, audio, or data included in the selected signal.

The splitter 30 distributes the signals received from the respective antennas to the tuners 34, 44, and 54. Therefore, when the splitter 30 distributes the signals as they are, the amplitudes of the signals transmitted to the respective tuners 34, 44, and 54 are decreased, resulting in a degradation of an S/N ratio. Thus, the amplifier 28 is provided in a stage preceding the splitter 30 so that the video signals are amplified and then distributed to the tuners 34, 44, and 54.

The amplifier 28 is supplied with a signal in a wide frequency band from a VHF band (90 MHz and higher) to a BS and CS band (2.1 GHz and lower). Hence, the amplifier 28 needs to perform amplification with a gain that is flat over the wide band. A circuit of the amplifier 28 will be described with reference to FIG. 2.

Figure 2:
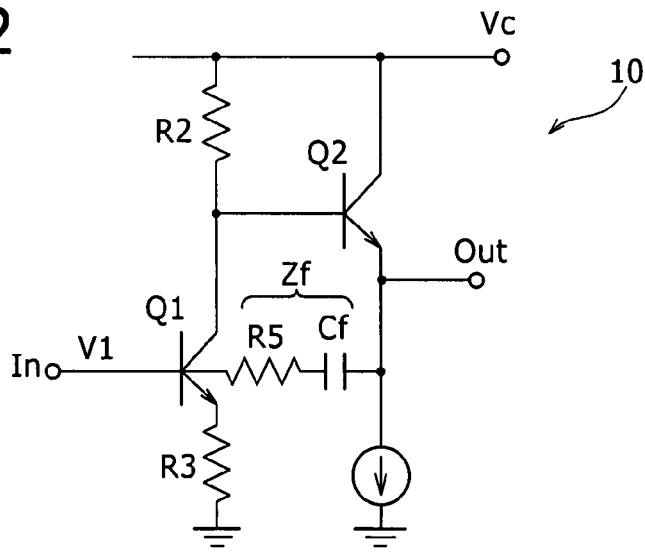
FIG. 2 is a circuit diagram of an amplifier according to an embodiment of the present invention.

FIG. 2 is a circuit diagram of the amplifier 28.

As shown in FIG. 2, in an amplifier circuit 10 of the amplifier 28, a high-frequency signal input from the antennas is input to the base (input terminal (In)) of a grounded-emitter first stage transistor Q1 so that the signal is amplified. The emitter of the first stage transistor Q1 is connected to a ground via a resistance R3, and the collector of the first stage transistor Q1 is connected to a power supply Vc via a resistance R2. By thus forming the first stage transistor Q1, a first amplified signal $V2 \approx V1 \times (R2/R3)$ appears at the collector of the first stage transistor Q1.

Next, when an emitter follower circuit is formed by inputting the first amplified signal output from the collector of the first stage transistor Q1 to the base of a succeeding stage transistor Q2, connecting the collector of the succeeding stage transistor Q2 to the power supply Vc, and connecting a constant-current source to the emitter of the succeeding stage transistor Q2, an inverted and amplified current output with respect to the signal input to the base of the first stage transistor Q1 is obtained from the emitter of the succeeding stage transistor Q2. In the embodiment shown in FIG. 2, the emitter of the succeeding stage transistor Q2 is used as an output terminal (Out).

Further, in the embodiment shown in FIG. 2, to match the input impedance of the input terminal (In), the inverted signal output by the succeeding stage transistor Q2 is fed back to the input terminal (In) via an input impedance matching element Zf formed by connecting a feedback resistance R5 and a feedback capacitor Cf in series with each other, whereby negative feedback is effected.

Letting Av be the gain of the amplifier circuit 10 shown in FIG. 2, and letting $\sin \theta$ be the input signal, a signal $Vo = -Av \times \sin \theta$ is output from the output terminal (Out). Then, the input signal $\sin \theta$ and the output signal $-Av \times \sin \theta$ are applied to both ends of the resistance R5. Because the input signal $\sin \theta$ and the output signal $-Av \times \sin \theta$ are opposite from each other in phase, the amplifier circuit 10 shown in FIG. 2 is virtually grounded at a point of $1/(1+Av)$ from the input terminal side of the resistance R5. Hence, the resistance R5 is viewed as $R5/(1+Av)$ from the input terminal side.

Thus, the input impedance of the amplifier circuit 10 is expressed as a value obtained when the base resistance rb of the first stage transistor Q1, a parasitic capacitance $C\pi$, and $R5/(1+Av)$ are connected in parallel with each other. Accordingly, when frequency f is low, the input impedance can be expressed as $(rb//R5/(1+Av))$, and when the frequency f is high, the input impedance can be expressed as $(1/(\omega \times C\pi)// R5/(1+Av))$.

When the frequency of the signal to be amplified is low, the input impedance of the amplifier circuit 10 is limited by the feedback resistance $R5/(1+Av)$. It is therefore possible to prevent an increase in the input impedance at low frequencies, and thus make the input impedance uniform over a wide band. It is also possible to optimize the input impedance of the amplifier circuit 10 by appropriately adjusting the feedback resistance R5 and the gain Av.

Figure 3:
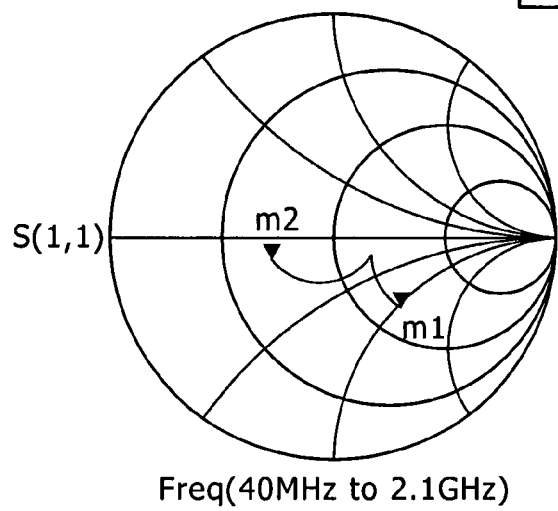
FIG. 3 is a Smith chart of input impedance when frequency is changed from 40 MHz to 2.1 GHz in an amplifier circuit shown in FIG. 2.

FIG. 3 is a Smith chart of the input impedance S11 when the frequency is changed from 40 MHz (mark m1) to 2.1 GHz (mark m2) in the amplifier circuit 10 shown in FIG. 2.

A calculation result shown in FIG. 3 indicates that a locus ranges from $S(1, 1)=0.4401/-44.119$ (the frequency of 40 MHz and a characteristic impedance=$Z0 \times (1.453-j1.093)$) to $S(1, 1)=0.287/-158.600$ (the frequency of 2.1 GHz and a characteristic impedance=$Z0 \times (0.568-j0.130)$).

Figure 11:
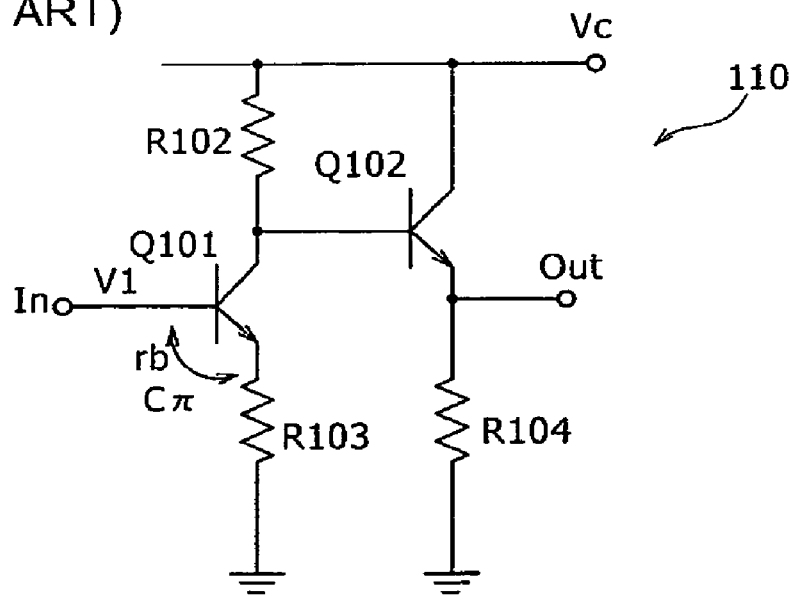
FIG. 11 is a circuit diagram of an amplifier circuit in related art.
Figure 12:
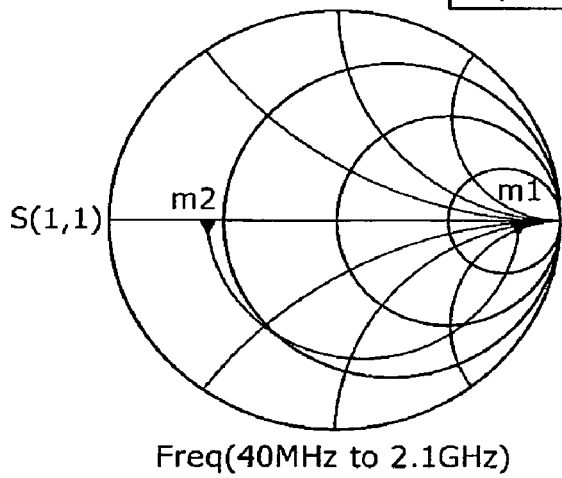
FIG. 12 is a Smith chart of input impedance when frequency is changed from 40 MHz to 2.1 GHz in the amplifier circuit shown in FIG. 11.

The input impedance S11 of the grounded-emitter type amplifier circuit 110 shown in FIG. 11 varies from a reference resistance Z0 to about 10×Z0 (mark m1 in FIG. 12) and to about 0.3×Z0 (mark m2 in FIG. 12) between 40 MHz to 2.1 GHz. However, the input impedance S11 of the amplifier circuit 10 shown in FIG. 2 varies from the reference resistance Z0 to about 1.8×Z0 (mark m1 in FIG. 3) and to 0.58×Z0 (mark m2 in FIG. 3) between 40 MHz to 2.1 GHz. Thus, the amplifier circuit 10 shown in FIG. 2 can reduce variations in the value of the input impedance S11 as compared with the grounded-emitter type amplifier circuit 110 shown in FIG. 11, and therefore obtain a flatter gain over a wide frequency band from the FM band or lower (40 MHz and higher) to the BS and CS band (2.1 GHz and lower).

The noise figure NF of the amplifier circuit 10 according to the embodiment of the present invention will next be described.

Figure 4:
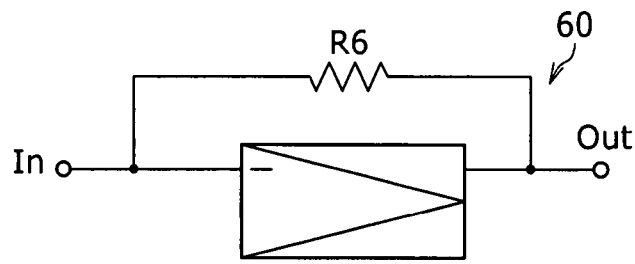
FIG. 4 is a circuit diagram of a common negative feedback amplifier circuit.

FIG. 4 is a diagram showing a common negative feedback amplifier circuit 60. The common negative feedback amplifier circuit 60 can be represented by a form in which a connection between an input terminal (In) and an output terminal (Out) is made by a feedback element R6.

Figure 5:
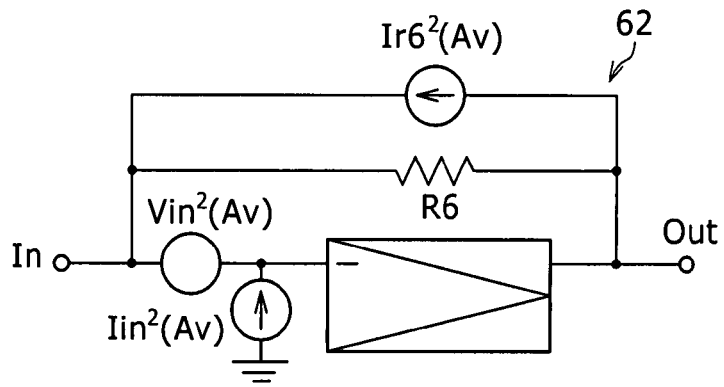
FIG. 5 is a diagram showing a negative feedback amplifier circuit in which noise sources in the negative feedback amplifier circuit shown in FIG. 4 are represented using Vin and Iin.

Next, FIG. 5 shows a negative feedback amplifier circuit 62 in which the average values of noise sources in the negative feedback amplifier circuit 60 shown in FIG. 4 are represented as $Vin^2$ (Av), $Iin^2$ (Av), and $Ir6^2$ (Av).

Figure 6:
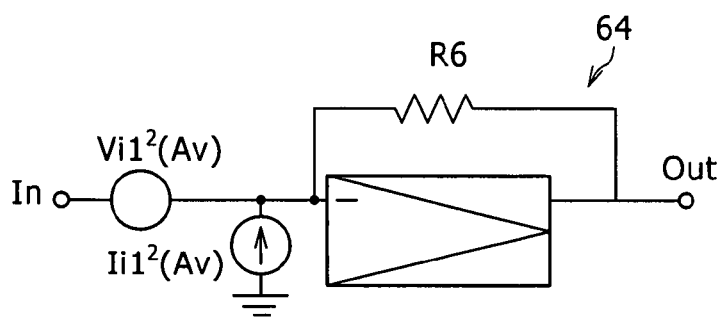
FIG. 6 is a diagram of a negative feedback amplifier circuit obtained by input conversion of the noise sources shown in FIG. 5.

FIG. 6 shows a negative feedback amplifier circuit 64 obtained by input conversion of the noise sources shown in FIG. 5. An equivalent input noise source (Ii1) shown in FIG. 6 can be expressed by (Equation 1) in the following.

$$Ii1 = Iin + Vin/R6 + Ir6 \quad \text{(Equation 1)}$$

Supposing that the noise sources in the above (Equation 1) are each independent, the average value $Ii1^2$ (Av) of the equivalent input noise source can be expressed by the following (Equation 2).

$$Ii1^2(Av) = Iin^2(Av) + Vin^2(Av)/R6^2 + 4KT\Delta f/R6 \quad \text{(Equation 2)}$$

Figure 7:
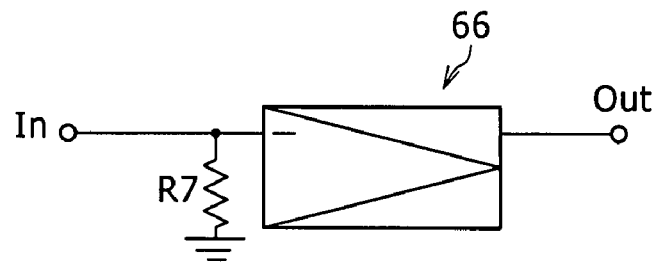
FIG. 7 is a diagram showing a negative feedback amplifier circuit in related art, in which impedance matching is performed by inserting a resistance for impedance matching between an input terminal and a ground.
Figure 8:
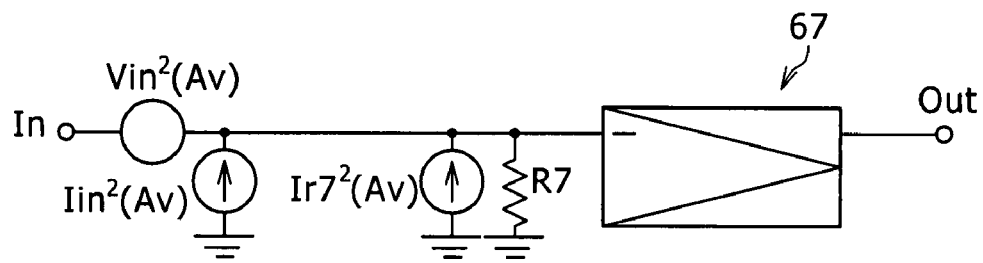
FIG. 8 is a diagram in which the average value $Ir7^2$ (Av) of noise generated by a resistance is added to the negative feedback amplifier circuit shown in FIG. 7.
Figure 9:
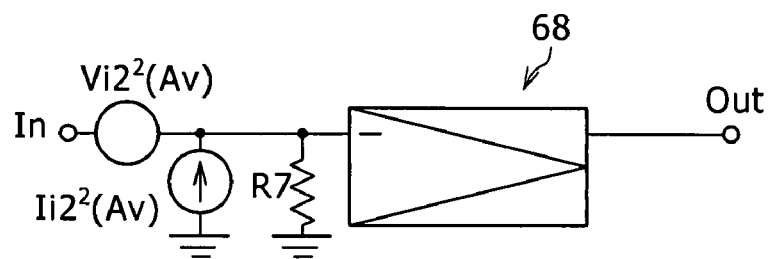
FIG. 9 is a diagram of a negative feedback amplifier circuit obtained by input conversion of the noise source of the resistance shown in FIG. 7.

Next, FIG. 7 shows a negative feedback amplifier circuit 66 in related art, in which impedance matching is performed by inserting a resistance R7 for impedance matching between an input terminal (In) and a ground. FIG. 8 shows a negative feedback amplifier circuit 67 obtained by adding the average values $Vin^2$ (Av) and $Iin^2$ (Av) of noise sources and the average value $Ir7^2$ (Av) of a noise source generated by the resistance R7 to the negative feedback amplifier circuit 66 shown in FIG. 7. FIG. 9 shows a negative feedback amplifier circuit 68 obtained by input conversion of the noise source of the resistance R7 shown in FIG. 7.

FIG. 9 is a diagram showing a negative feedback amplifier circuit 68 obtained by input conversion of the input noise sources $Vin^2$ (Av) and $Iin^2$ (Av) and the noise caused by the resistance R7 in the negative feedback amplifier circuit 66 shown in FIG. 7. The average value $Ii2^2$ (Av) of an equivalent input noise source can be expressed by the following (Equation 3) using the above (Equation 2).

$$Ii2^2(Av) = Iin^2(Av) + Vin^2(Av)/R7^2 + 4KT\Delta f/R7 \quad \text{(Equation 3)}$$

Figure 13:
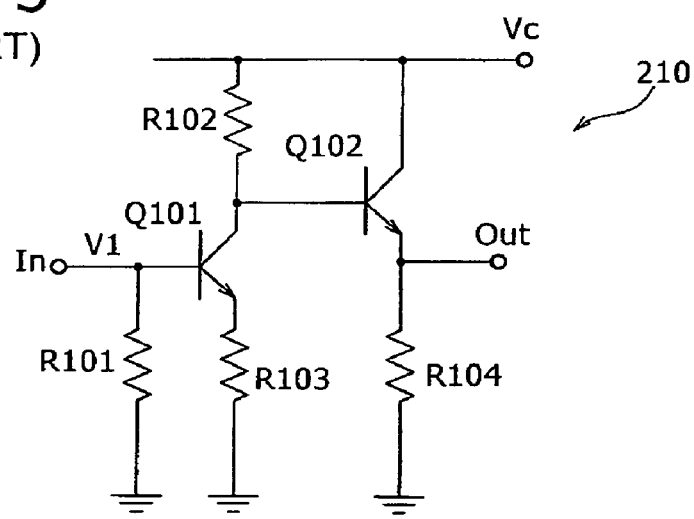
FIG. 13 is a circuit diagram in which impedance matching is performed by inserting an input resistance at the base of a first stage transistor to stabilize a gain over a wide band.

The above-described (Equation 2) and (Equation 3) indicate that noises occurring in the negative feedback amplifier circuits 64 and 68 increase with reciprocals of the respective resistances R6 and R7. Incidentally, according to the embodiment of the present invention, the ratio of a value of R7/R6 is 1/(1+Av). Thus, the noise figure can be reduced by inserting the input impedance matching element Zf, which is formed by connecting the feedback resistance R5 and the feedback capacitor Cf in series with each other as shown in FIG. 2, and thereby effecting negative feedback, rather than connecting the resistance R101 for input impedance matching between the input terminal (In) and the ground as shown in FIG. 13.

Figure 10:
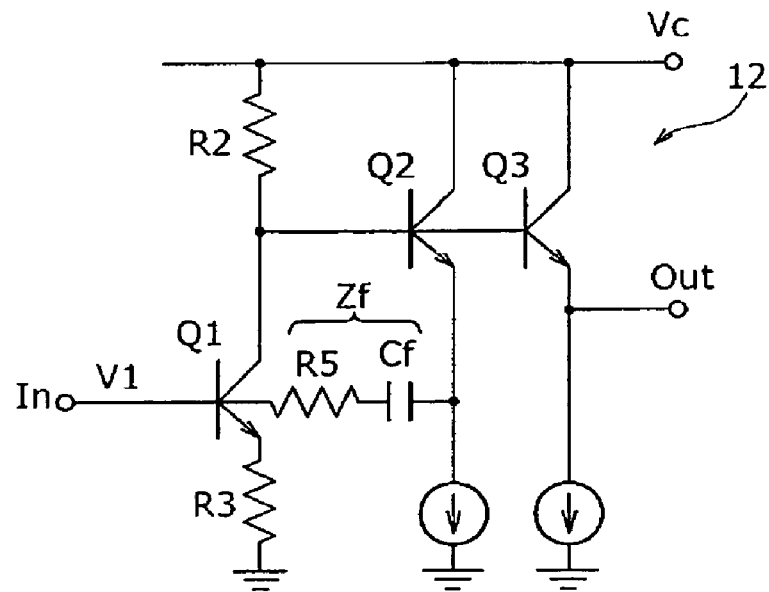
FIG. 10 is a diagram showing an amplifier circuit according to another embodiment of the present invention.

Next, FIG. 10 shows an amplifier circuit according to another embodiment of the present invention.

FIG. 10 is a diagram showing an embodiment of an amplifier circuit 12 in which a first succeeding stage transistor Q2 for outputting power for negative feedback and a second succeeding stage transistor Q3 for outputting an inverted signal to the outside are provided independently of each other.

As shown in FIG. 10, the first succeeding stage transistor Q2 receives a first amplified signal output by a first stage transistor Q1 from a base, and then outputs an inverted signal from an emitter. The inverted signal output by the first succeeding stage transistor Q2 is supplied to an input impedance matching element Zf formed by a feedback resistance R5 and a feedback capacitor Cf as well as a constant-current circuit.

Further, in order to output the signal after amplification to the outside, the amplifier circuit 12 has the second succeeding stage transistor Q3 that receives the first amplified signal output by the first stage transistor Q1 from a base, and has an output terminal for outputting the signal from an emitter.

By thus providing the first succeeding stage transistor Q2 for outputting power for feedback and the second succeeding stage transistor Q3 for outputting the signal to the outside independently of each other, it is possible to make a signal output path and a negative feedback path independent of each other. Then, input impedance as viewed from an input terminal (In) is determined by the feedback resistance R5 and the feedback capacitor Cf, and is independent of a load connected to the output terminal (Out). Therefore the input impedance S11 can be stabilized.

It should be understood by those skilled in the art that various modifications, combinations, sub-combinations and alterations may occur depending on design and other factors insofar as they are within the scope of the appended claims or the equivalents thereof.

What is claimed is:

1. An RF amplifier circuit formed by multiple transistor stages and having an input terminal for a signal and an inverted output terminal configured to output an inverted signal after amplification,
   wherein a feedback resistance and a feedback capacitor for input impedance matching are connected in series with each other between said inverted output terminal and said input terminal;
   wherein values for said feedback resistance and feedback capacitor are selected to provide an input impedance match for the amplifier circuit across a range of frequencies so that a more constant gain is obtained over a desired range of frequencies.

2. An RF amplifier circuit configured to amplify and output a signal input from an input terminal, said amplifier circuit being formed by multiple transistor stages, said amplifier circuit comprising:
   a first stage transistor configured to receive a signal from a base functioning as said input terminal, and output a first amplified signal from a collector;
   a first succeeding stage transistor configured to receive the first amplified signal output by said first stage transistor from a base, and output an inverted signal from one of an emitter and a collector; and
   an input impedance matching element configured to feed back the inverted signal output by said first succeeding stage transistor to said input terminal via a feedback resistance and a feedback capacitor connected in series with each other;
   wherein values for said feedback resistance and feedback capacitor are selected to provide an input impedance match for the amplifier circuit across a range of frequencies so that a more constant gain is obtained over a desired range of frequencies.

3. The amplifier circuit according to claim 2, further comprising
   a second succeeding stage transistor that receives the first amplified signal output by said first stage transistor from a base, and has an output terminal configured to output the signal from one of an emitter and a collector to an outside.

4. A receiving device configured to receive an RF signal including a plurality of frequency bands and obtaining data, said receiving device comprising:
- an input terminal configured to receive the signal of said plurality of frequency bands;
- an amplifier circuit formed by multiple transistor stages, said amplifier circuit including a feedback resistance and a feedback capacitor for input impedance matching, said feedback resistance and said feedback capacitor being connected in series with each other between said input terminal and an inverted output terminal configured to output an inverted signal after amplification;
- a splitter configured to divide the signal amplified by said amplifier circuit;
- a band-pass filter configured to extract a signal in a predetermined frequency band from the divided signal; and
- a tuner configured to select a specific frequency from the extracted signal, and obtain data included in a signal of the selected frequency;
- wherein values for said feedback resistance and feedback capacitor are selected to provide an input impedance match for the amplifier circuit across a range of frequencies so that a more constant gain is obtained over a desired range of frequencies.

* * * * *